(12) United States Patent　　(10) Patent No.: US 12,040,227 B2
Lu　　(45) Date of Patent: Jul. 16, 2024

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 424 days.

(21) Appl. No.: 17/509,162

(22) Filed: Oct. 25, 2021

(65) Prior Publication Data

US 2022/0044964 A1　　Feb. 10, 2022

Related U.S. Application Data

(63) Continuation of application No. PCT/CN2021/100793, filed on Jun. 18, 2021.

(30) Foreign Application Priority Data

Jul. 16, 2020　(CN) .......................... 202010686388.0

(51) Int. Cl.
　　*H01L 21/768*　　(2006.01)
　　*H01L 21/3213*　　(2006.01)

(52) U.S. Cl.
　　CPC .. *H01L 21/76834* (2013.01); *H01L 21/32139* (2013.01); *H01L 21/76841* (2013.01)

(58) Field of Classification Search
　　CPC ......... H01L 21/32139; H01L 21/76834; H01L 21/76885; H01L 29/6653; H01L 29/66553;

(Continued)

(56) References Cited

U.S. PATENT DOCUMENTS 8,507,374 B2　　8/2013　Kim
9,293,362 B2　　3/2016　Lee et al.
(Continued)

FOREIGN PATENT DOCUMENTS

CN　　101207149 A　　6/2008
CN　　103903994 A　　7/2014
(Continued)

OTHER PUBLICATIONS

International Search Report in the international application No. PCT/CN2021/100793, mailed on Sep. 18, 2021.

(Continued)

*Primary Examiner* — Daniel P Shook
(74) *Attorney, Agent, or Firm* — Kilpatrick Townsend & Stockton LLP

(57) ABSTRACT

Provided are a semiconductor structure and a method for manufacturing the same. The method for manufacturing a semiconductor structure includes that a substrate is provided, and a first structure is formed on the substrate; a first supporting layer is formed, the first supporting layer covering the first structure; a second supporting layer is formed, the second supporting layer covering the first supporting layer; and the first supporting layer and the second supporting layer on an upper surface of the first structure, and the first supporting layer between the first structure and the second supporting layer are removed, a top surface of the second supporting layer being higher than the top surface of the first structure.

10 Claims, 21 Drawing Sheets

(58) Field of Classification Search
CPC ... H01L 29/6656; H10B 12/31; H10B 12/482; H10B 12/485
See application file for complete search history.

(56) References Cited

U.S. PATENT DOCUMENTS

| | | |
|---|---|---|
| 9,431,514 B2 | 8/2016 | Liu et al. |
| 10,062,714 B2 | 8/2018 | Doris et al. |
| 10,559,570 B2 | 2/2020 | Nagai |
| 10,658,489 B2 | 5/2020 | Zheng et al. |
| 2012/0025296 A1 | 2/2012 | Kim |
| 2014/0175659 A1 | 6/2014 | Lee et al. |
| 2016/0172304 A1 | 6/2016 | Lee et al. |
| 2016/0181395 A1 | 6/2016 | Liu et al. |
| 2016/0293638 A1 | 10/2016 | Doris et al. |
| 2018/0261610 A1 | 9/2018 | Zheng et al. |
| 2019/0088767 A1* | 3/2019 | Xie ................. H01L 29/6656 |
| 2019/0221569 A1 | 7/2019 | Nagai |
| 2020/0152636 A1 | 5/2020 | Nagai |
| 2020/0152639 A1 | 5/2020 | Ho et al. |

FOREIGN PATENT DOCUMENTS

| | | |
|---|---|---|
| CN | 108321090 A | 7/2018 |
| CN | 108574005 A | 9/2018 |
| CN | 109950312 A | 6/2019 |
| CN | 110896032 A | 3/2020 |
| CN | 210272309 U | 4/2020 |
| CN | 111162076 A | 5/2020 |
| KR | 20080088098 A | 10/2008 |

OTHER PUBLICATIONS

International Search Report in the international application No. PCT/CN2021/103618, mailed on Sep. 29, 2021, 3 pgs.
International Search Report in the international application No. PCT/CN2021/100793, mailed on Sep. 18, 2021, 2 pgs.

* cited by examiner understand# SEMICONDUCTOR STRUCTURE AND METHOD FOR MANUFACTURING SAME

CROSS-REFERENCE TO RELATED APPLICATIONS

The present application is a continuation application of International Application No. PCT/CN2021/100793, filed on Jun. 18, 2021, which claims priority to Chinese Patent Application No. 202010686388.0, filed on Jul. 16, 2020. International Application No. PCT/CN2021/100793 and Chinese Patent Application No. 202010686388.0 are hereby incorporated by reference in their entireties.

BACKGROUND

A dynamic random access memory (DRAM) is a semiconductor memory. With the development of a semiconductor technology, a manufacturing procedure of the DRAM is continuously miniaturized, so that a bit line (BL) in the DRAM is also miniaturized.

However, such a thin bit line wall of the bit line after etching is liable to distort or tilt, so that a sidewall spacer layer subsequently deposited on the sidewalls of the bit line cannot wrap the sidewall well and a wire cannot be filled between a transistor and a capacitor well, thereby influencing the performance of the DRAM.

SUMMARY

The present disclosure relates to the technical field of an integrated circuit, and in particular to a semiconductor structure and a method for manufacturing the same.

According to various embodiments, a semiconductor structure and a method for manufacturing the same are provided.

A method for manufacturing a semiconductor structure includes the following operations.

A substrate is provided, in which a first structure is formed on the substrate.

A first supporting layer is formed, which covers the first structure.

A second supporting layer is formed, which covers the first supporting layer.

The first supporting layer and the second supporting layer on an upper surface of the first structure, and the first supporting layer between the first structure and the second supporting layer are removed, a top surface of the second supporting layer being higher than a top surface of the first structure.

Based on the same inventive concept, a semiconductor structure is provided. The semiconductor structure is manufactured by the method of any of the above embodiments.

BRIEF DESCRIPTION OF THE DRAWINGS

In order to describe the technical solutions in the embodiments of the present disclosure or the conventional art more clearly, the drawings needed to be used in the embodiments or the conventional art will be simply introduced below. It is apparent that the drawings in the following description are only some embodiments of the present disclosure. Those of ordinary skill in the art may further obtain other drawings according to these drawings without creative work.

DETAILED DESCRIPTION

Figure 1:
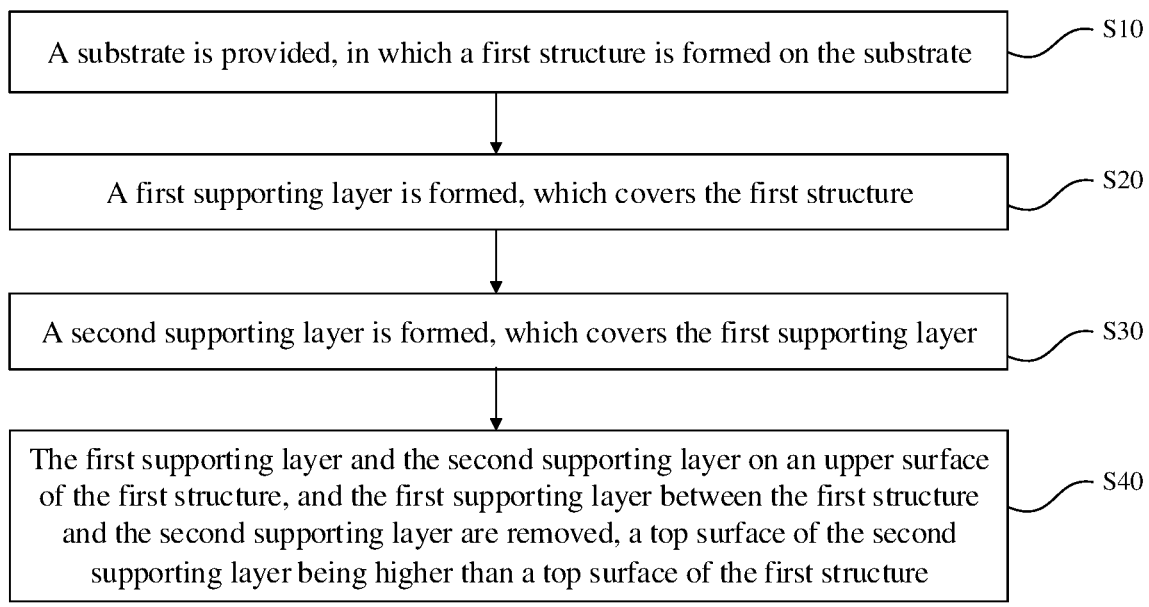
FIG. 1 is a flow chart of a method for manufacturing a semiconductor structure provided in one embodiment.

To facilitate an understanding of the present disclosure, the present disclosure will be described below in detail with reference to the accompanying drawings. Preferred embodiments of the present disclosure are given in the accompanying drawings. However, the present disclosure may be embodied in many different forms and should not be limited to the embodiments set forth herein. Rather, these embodiments are provided so that the present disclosure will be thorough and complete.

Unless defined otherwise, all technical and scientific terms used herein have the same meaning as commonly understood by those of ordinary skill in the art to which the present disclosure belongs. The terms used herein in the specification of the present disclosure are for the purpose of describing specific embodiments only and are not intended to limit the present disclosure.

It is to be understood that when an element or a layer is referred to as being "on", "adjacent to", "connected to", or "coupled to", to other elements or layers, it may be directly on, adjacent to, connected to, or coupled to the other elements or layers, or an intervening element or layer may be present. Rather, when an element is referred to as being "directly on", "directly adjacent to", "directly connected to", or "directly coupled to" other elements or layers, an intervening element or layer is not present. It is to be understood that although the terms first, second, third, and the like may be used to describe various elements, components, regions, layers, doping types, and/or parts, these elements, components, regions, layers, doping types, and/or parts should not be limited by these terms. These terms are only used to distinguish one element, component, region, layer, doping type, or part from another element, component, region, layer, doping type, or part. Therefore, a first element, component, region, layer, doping type, or part discussed below may be represented as a second element, component, region, layer, or part without departing from the teachings of embodiments of the present disclosure. For example, the first doping type may be the second doping type, and similarly, the second doping type may be the first doping type. The first doping type and the second doping type are different doping types, for example, the first doping type may be P-type and the second doping type may be N-type, or the first doping type may be N-type and the second doping type may be P-type.

Spatial relation terms such as "under", "underneath", "lower", "below", "above", "upper", and the like, may be used herein to describe a relation between one element or feature and other elements or features as illustrated in the figures. It is to be understood that in addition to the orientation shown in the figures, the spatial relation terms further include different orientations of a device in use and operation. For example, if the device in the figures is turned over, the element or feature described as "underneath the other element" or "below it" or "under it" will be oriented "over" the other element or feature. Therefore, the exemplary terms "underneath" and "below" may include both upper and lower orientations. In addition, the device may also include additional orientations (for example, rotated 90 degrees or other orientations), and the spatial descriptors used herein are interpreted accordingly.

As used herein, the singular forms "a", "an", and "the/the" may include the plural forms as well, unless the context clearly indicates otherwise. It is also to be understood that when the terms "constitute/consist" and/or "comprise/include" are used in the specification, the presence of a stated feature, integer, step, operation, element, and/or component may be determined, but the presence or addition of one or more other features, integers, steps, operations, elements, components, and/or groups is not precluded. Moreover, the term "and/or" used herein includes any and all combinations of the associated listed items.

The embodiments of the disclosure are described herein with reference to sectional views that are used as schematic diagrams of ideal embodiments (intervening structures) of the embodiments of the present disclosure, so that changes in shape due to, for example, a manufacturing technique and/or a tolerance may be expected. Therefore, the embodiments of the present disclosure should not be limited to special shapes of regions shown herein but include shape deviations caused by the manufacturing technique. For example, an injection region shown as a rectangle typically has a round or bending feature and/or injection concentration gradient at an edge thereof, rather than a binary change from the injection region to a non-injection region. Likewise, a burial region formed through injection may result in some injection in a region between the burial region and a surface through which the injection is performed. Therefore, the regions shown in the figures are substantially schematic, and shapes thereof neither represent actual shapes of the regions of the device nor limit the scope of the embodiments of the present disclosure.

Referring to FIG. 1, one embodiment provides a method for manufacturing a semiconductor structure. The method for manufacturing a semiconductor structure includes the following operations.

In S10, a substrate 10 is provided, and a first structure 20 is formed on the substrate 10.

In S20, a first supporting layer 510 is formed, the first supporting layer 510 covering the first structure 20.

In S30, a second supporting layer 520 is formed, the second supporting layer 520 covering the first supporting layer 510.

In S40, the first supporting layer 510 and the second supporting layer 520 on the upper surface of the first structure 20, and the first supporting layer 510 between the first structure 20 and the second supporting layer 520 are removed, the top surface of the second supporting layer 520 being higher than the top surface of the first structure 20.

According to the above method for manufacturing a semiconductor structure, the first structure 20 is formed on the substrate 10, the first supporting layer 510 covering the first structure 20 is formed on the surface of the first structure 20, and the second supporting layer 520 covering the first supporting layer 510 is formed on the surface of the first supporting layer 510. The first supporting layer 510 and the second supporting layer 520 on the upper surface of the first structure 20, and the first supporting layer 510 between the first structure 20 and the second supporting layer 520 are removed, in which the top surface of the second supporting layer 520 is higher than the top surface of the first structure 20. Since the first supporting layer 510 and the second supporting layer 520 are formed on sidewalls of the first structure 20, the first supporting layer 510 and the second supporting layer 520 may provide support for the first structure 20 in a manufacturing procedure of the semiconductor structure, thereby ensuring that the remaining structures after the first structure 20 is etched will not distort or tilt. In addition, since the top surface of the second supporting layer 520 is higher than the top surface of the first structure 20, a mask layer may be formed on the upper surface of the first structure 20 along the horizontal direction by taking the second supporting layer 520 as the center in a subsequent process, so that the self-alignment in an etching procedure of the first structure 20 is achieved, and the manufacturing precision of the semiconductor structure is improved.

It will be appreciated that although various steps in the flow charts of FIG. 1 are shown sequentially as indicated by the arrows, these steps are not necessarily performed sequentially as indicated by the arrows. Unless explicitly stated otherwise herein, the steps are not performed in a strict order limitation, and the steps may be performed in other orders. Moreover, at least part of the steps of FIG. 1 may include a plurality of steps or phases that are not necessarily performed at the same time, but may be performed at different times. The steps or phases are not necessarily performed sequentially, but may be performed in turn or alternately with at least part of the other steps or the steps or phases of the other steps.

In one embodiment, the substrate 10 provided in S10 may include any existing semiconductor substrate 10. In the embodiment, the substrate 10 may include, but is not limited to, a silicon substrate. A shallow trench isolating structure may be formed in the substrate 10, and the shallow trench isolating structure isolates a plurality of active regions arranged at intervals in the substrate 10.

In one embodiment, in S10, the operation that a first structure 20 is formed on the substrate 10 includes the following operations.

In S110, a double-bit-line to-be-etched structure 210 is formed on the upper surface of the substrate 10.

In S120, first sidewall structures 40 are formed on sidewalls of the double-bit-line to-be-etched structure 210, and the double-bit-line to-be-etched structure 210 and the first sidewall structures 40 together form the first structure 20.

In one embodiment, in S110, the operation that the double-bit-line to-be-etched structure 210 is formed on the upper surface of the substrate 10 includes the following operations.

In S111, a bit line material layer 310 including a bit line barrier layer 311, a bit line conductive layer 312 and a covering insulating layer 313 is formed on the upper surface of the substrate 10.

In S112, the bit line material layer 310 is etched to obtain the double-bit-line to-be-etched structure 210, and the substrate 10 is exposed between adjacent double-bit-line to-be-etched structures 210.

Figure 2:
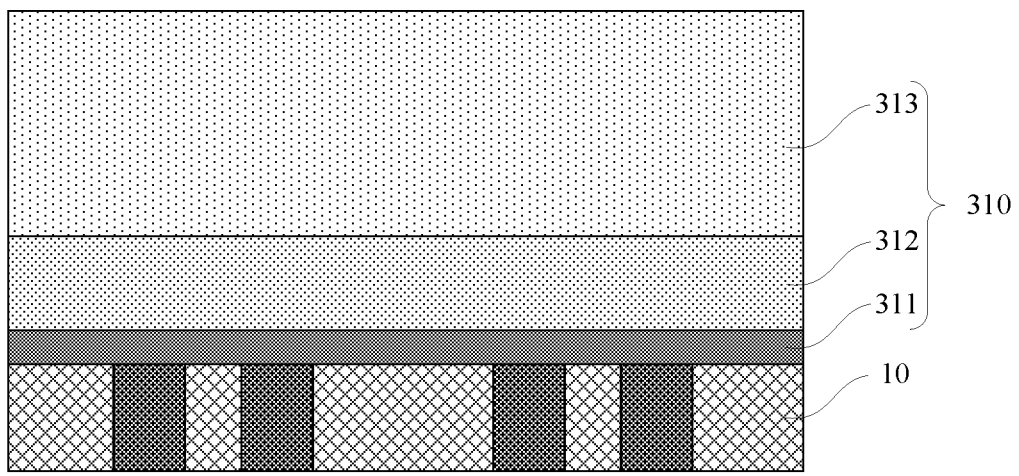
FIG. 2 is a schematic sectional view of a structure obtained after a bit line material layer including a bit line barrier layer, a bit line conductive layer and a covering insulating layer is formed on an upper surface of a substrate in a method for manufacturing a semiconductor structure provided in one embodiment.

Referring to FIG. 2, in one embodiment, in S111, a bit line barrier layer 311, a bit line conductive layer 312 and a covering insulating layer 313 are sequentially formed on the upper surface of the substrate 10 by adopting a deposition process. The material and thickness of the bit line barrier layer 311, the bit line conductive layer 312, and the covering insulating layer 313 may be set according to an actual requirement. In the embodiment, the bit line barrier layer 311 may include, but is not limited to, a titanium nitride (TiN) layer. The bit line conductive layer 312 may include, but is not limited to, a tungsten layer. The covering insulating layer 313 may include, but is not limited to, a silicon nitride layer.

Figure 3:
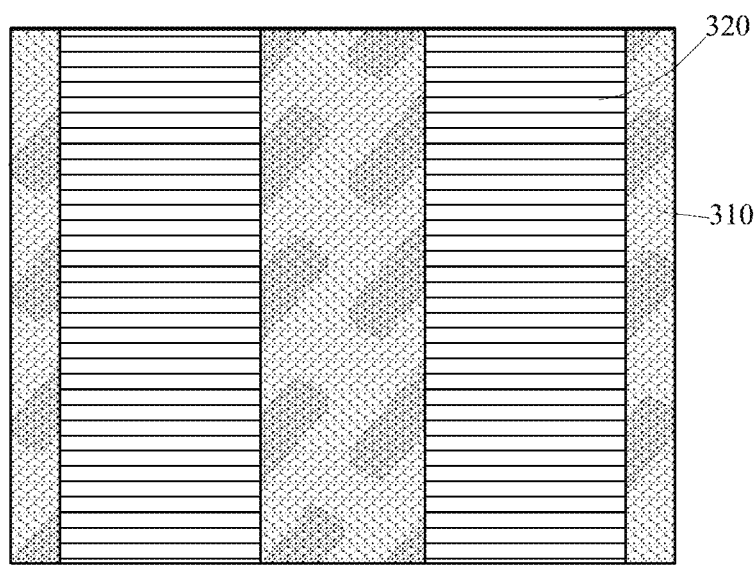
FIG. 3 is a schematic sectional view of a structure obtained after a photoresist layer is formed on an upper surface of a bit line material layer and the photoresist layer is patterned to form a mask layer for photoetching in a method for manufacturing a semiconductor structure provided in one embodiment.
Figure 4:
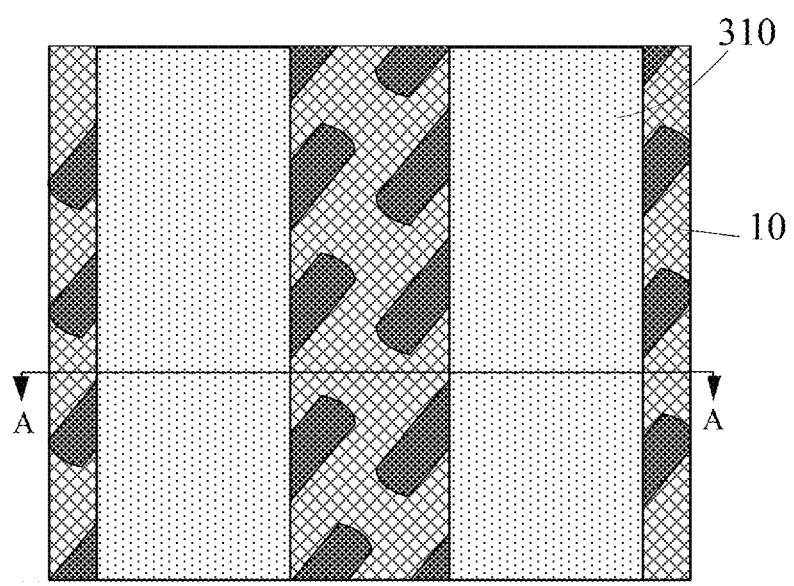
FIG. 4 is a schematic top view of a double-bit-line to-be-etched structure obtained after a bit line material layer is etched and a photoresist layer is removed in a method for manufacturing a semiconductor structure provided in one embodiment.
Figure 5:
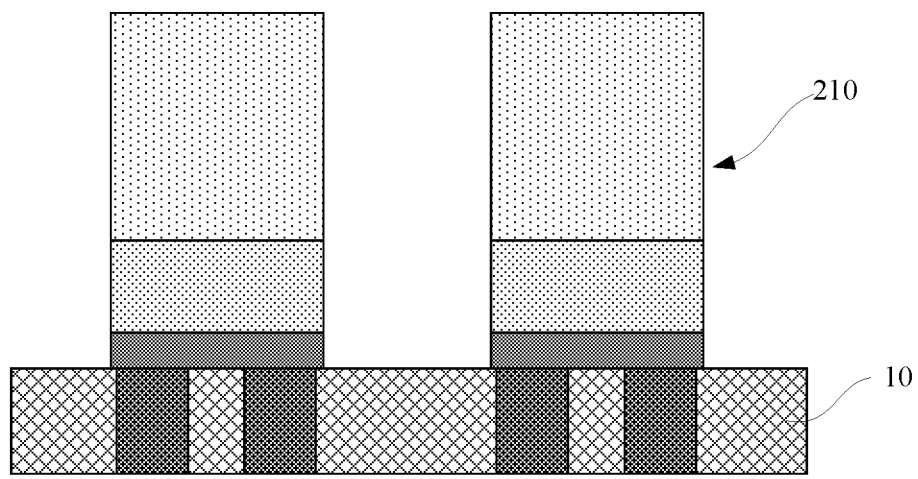
FIG. 5 is a schematic sectional view along a direction A-A in FIG. 4 of a double-bit-line to-be-etched structure obtained after a bit line material layer is etched and a photoresist layer is removed in a method for manufacturing a semiconductor structure provided in one embodiment.

Referring to FIG. 3 to FIG. 5, in one embodiment, in S112, a photoresist layer may be formed on the upper surface of the bit line material layer 310 by adopting, but not limited to, a spin-on process, and the photoresist layer is patterned to form a photoetching mask layer 320. A plurality of double-bit-line to-be-etched structures 210 may be formed by etching the bit line material layer 310 to the upper surface of the substrate 10 based on the photoetching mask layer 320. Finally, the photoetching mask layer 320 may be removed. In the embodiment, the width of one double-bit-line to-be-etched structure 210 may be the sum of the width between two adjacent bit lines 30 and the widths of the two bit lines 30, thereby ensuring that two adjacent bit lines 30 may be formed on the upper surface of the substrate 10 after etching the double-bit-line to-be-etched structures 210.

In one embodiment, in S120, the operation that first sidewall structures 40 are formed on the sidewalls of the double-bit-line to-be-etched structure 210 includes the following operations.

In S121, a first sidewall spacer layer 410 is formed on the sidewalls of the double-bit-line to-be-etched structure 210.

S122, a second sidewall spacer layer 420 is formed on the surface of the first sidewall spacer layer 410.

S123, a third sidewall spacer layer 430 is formed on the upper surface of the double-bit-line to-be-etched structure 210, the surface of the second sidewall spacer layer 420, and the upper surface of the substrate 10.

The first sidewall spacer layer 410, the second sidewall spacer layer 420 and the third sidewall spacer layer 430 together constitute the first sidewall structures 40.

Figure 6:
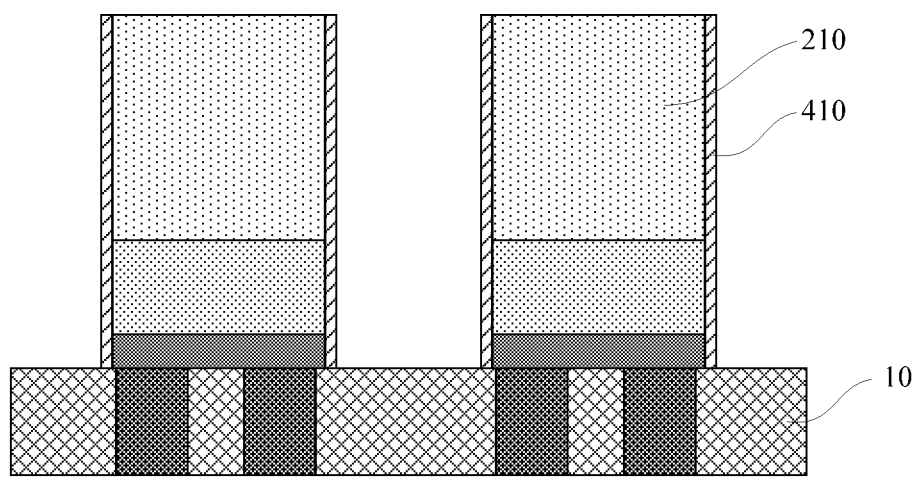
FIG. 6 is a schematic sectional view of a structure obtained after a first sidewall spacer layer is formed on a sidewall of a double-bit-line to-be-etched structure, in a method for manufacturing a semiconductor structure provided in one embodiment.

Referring to FIG. 6, in one embodiment, in S121, a first sidewall spacer material layer may be formed by adopting, but not limited to, a deposition process. In the embodiment, due to the good step coverage of an atomic layer deposition (ALD) process, a single ALD process may be adopted to form the first sidewall spacer material layer on the upper surface and sidewall of the double-bit-line to-be-etched structure 210, and the upper surface of the substrate 10. Subsequently, the first sidewall spacer material layer may be etched by adopting, but not limited to, a dry etching process to remove the first sidewall spacer material on the upper surface of the double-bit-line to-be-etched structure 210 and on the upper surface of the substrate 10 to form the first sidewall spacer layer 410. The dry etching process may adopt $SF_6$, $CF_4$, $CHF_3$, $O_2$, Ar, or a mixed gas of the above gases, and the selection of a specific gas may be set according to the actual requirement. In addition, the material and thickness of the first sidewall spacer layer 410 may be set according to the actual requirement. In the embodiment, the first sidewall spacer layer 410 may include, but is not limited to, a silicon nitride layer.

Figure 7:
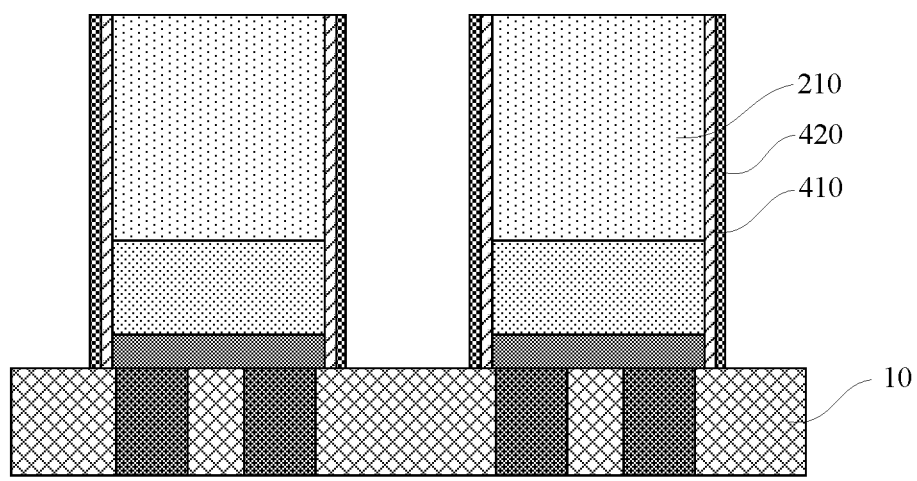
FIG. 7 is a schematic sectional view of a structure obtained after a second sidewall spacer layer is formed on a surface of a first sidewall spacer layer in a method for manufacturing a semiconductor structure provided in one embodiment.

Referring to FIG. 7, in one embodiment, in S122, a second sidewall spacer material layer may be formed by adopting, but not limited to, a deposition process. In the embodiment, due to the good step coverage of the ALD process, the ALD process may be adopted to form the second sidewall spacer material layer on the upper surface of the double-bit-line to-be-etched structure 210, the surface of the first sidewall spacer layer 410, and the upper surface of the substrate 10. Subsequently, the second sidewall spacer material layer may be etched by adopting, but not limited to, a dry etching process to remove the second sidewall spacer material on the upper surface of the double-bit-line to-be-etched structure 210 and on the upper surface of the substrate 10 to form the second sidewall spacer layer 420. The dry etching process may adopt $SF_6$, $CF_4$, $CHF_3$, $O_2$, Ar, or the mixed gas of the above gases, and the selection of the specific gas may be set according to the actual requirement. In addition, the material and thickness of the second sidewall spacer layer 420 may be set according to the actual requirement. In the embodiment, the second sidewall spacer layer 420 may include, but is not limited to, a silicon oxide layer.

Figure 8:
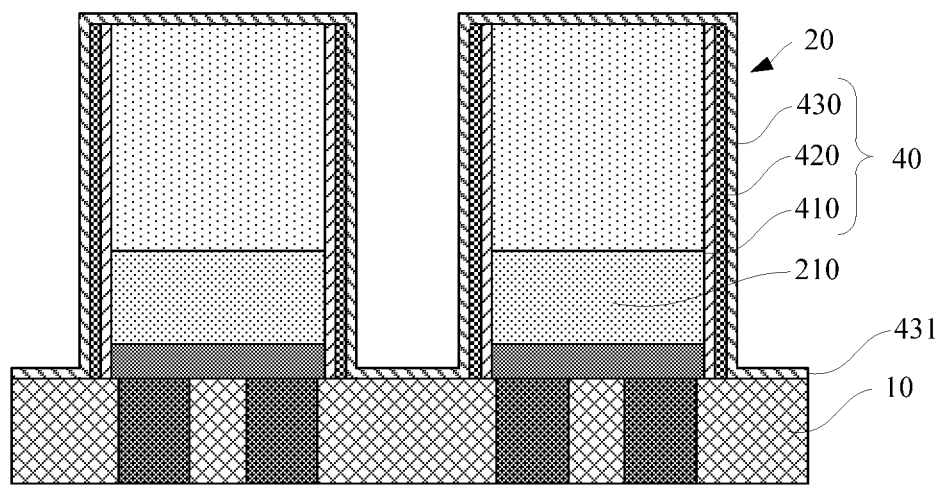
FIG. 8 is a schematic sectional view of a structure obtained after a third sidewall spacer layer is formed on an upper surface of a double-bit-line to-be-etched structure, a surface of a second sidewall spacer layer, and an upper surface of a substrate, in a method for manufacturing a semiconductor structure provided in one embodiment.

Referring to FIG. 8, in one embodiment, in S123, a third sidewall spacer material layer 431 may be formed by adopting, but not limited to, a deposition process. In the embodiment, due to the good step coverage of the ALD process, the ALD process may be adopted to form the third sidewall spacer material layer 431 on the upper surface of the double-bit-line to-be-etched structure 210, the surface of the second sidewall spacer layer 420, and the upper surface of the substrate 10. The material and thickness of the third sidewall spacer layer 430 may be set according to the actual requirement. In the embodiment, the third sidewall spacer layer 430 may include, but is not limited to, the silicon nitride layer.

In one embodiment, after the third sidewall spacer material layer 431 is on the upper surface of the double-bit-line to-be-etched structure 210, the surface of the second sidewall spacer layer 420, and the upper surface of the substrate 10, the third sidewall spacer material layer 431 may not be etched, that is, all of the third sidewall spacer material layer 431 is retained to protect the double-bit-line to-be-etched structure 210 and the substrate 10 during the formation and removal of the bit line supporting structures 50.

In one embodiment, the first sidewall structures 40 includes a first silicon nitride layer, a silicon oxide layer, and a second silicon nitride layer which are sequentially stacked from the sidewalls of the double-bit-line to-be-etched structure 210 to outsides. The second silicon nitride layer also covers the upper surface of the double-bit-line to-be-etched structure 210 and the exposed upper surface of the substrate 10. In the embodiment, the second silicon nitride layer serves as a protective layer to protect the double-bit-line to-be-etched structure 210 and the substrate 10 during the formation and removal of the bit line supporting structures 50.

Figure 9:
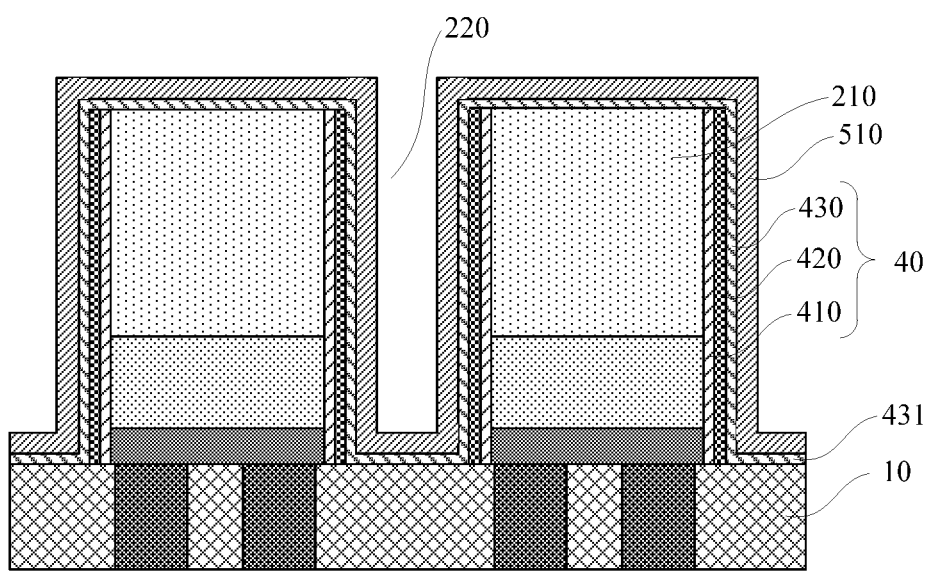
FIG. 9 is a schematic sectional view of a structure obtained after a first supporting layer is formed on an upper surface of a double-bit-line to-be-etched structure, a surface of a second sidewall spacer layer and the upper surface of a substrate in a method for manufacturing a semiconductor structure provided in one embodiment.

Referring to FIG. 9, in one embodiment, in S20, the first supporting layer 510 may be formed by adopting, but not limited to, a deposition process. In the embodiment, the ALD process may be adopted to form the first supporting layer 510 on the upper surface of the double-bit-line to-be-etched structure 210, the surface of the first sidewall structures 40, and the upper surface of the substrate 10. After the first supporting layer 510 is formed, a gap 220 is formed between adjacent double-bit-line to-be-etched structures 210. The material and thickness of the first supporting layer 510 may be set according to the actual requirement. In the embodiment, the first supporting layer 510 may include the silicon oxide layer.

Figure 10:
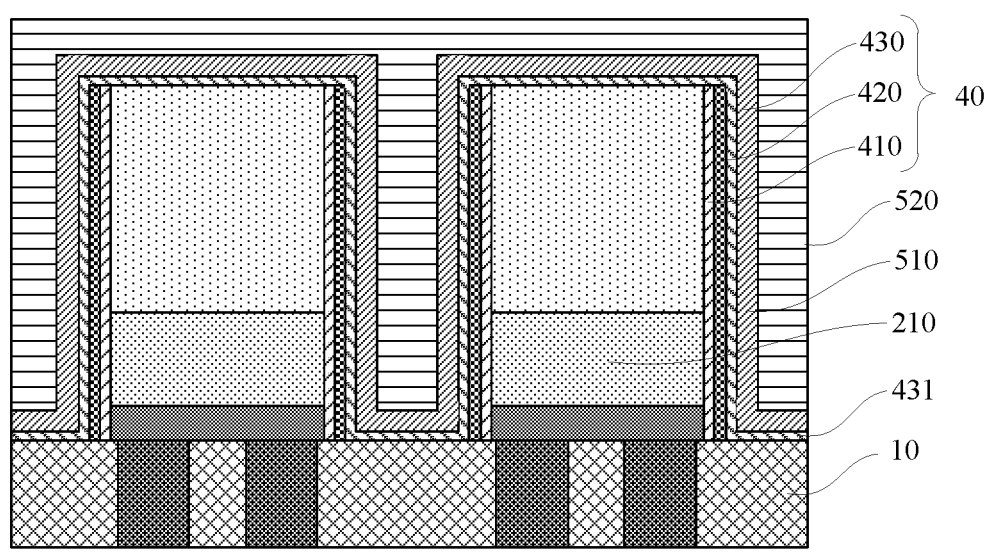
FIG. 10 is a schematic sectional view of a structure obtained after a second supporting layer is formed in a gap in a method for manufacturing a semiconductor structure provided in one embodiment.

Referring to FIG. 10, in one embodiment, in S30, the second supporting layer 520 may be formed by adopting, but not limited to, a deposition process. In the embodiment, the gap 220 may be filled by adopting a low pressure chemical vapor deposition (LPCVD) process to form the second supporting layer 520 in the gap 220. The second supporting layer 520 may be higher than the double-bit-line to-be-etched structure 210. The material and thickness of the second supporting layer 520 may be set according to the actual requirement. In the embodiment, the second supporting layer 520 may comprise a polysilicon layer.

Figure 11:
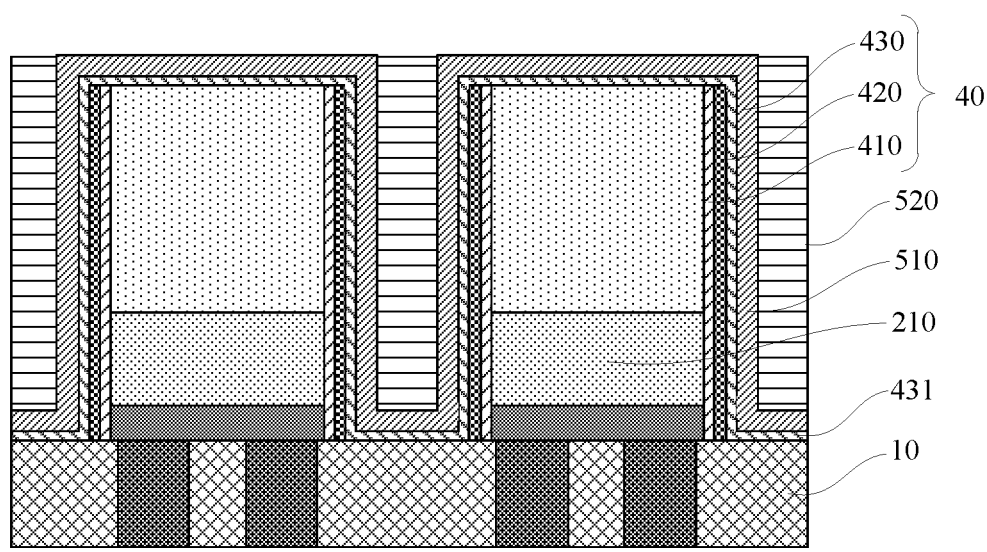
FIG. 11 is a schematic sectional view of a structure obtained after a second supporting layer is etched to expose a first supporting layer on a top of a double-bit-line to-be-etched structure in a method for manufacturing a semiconductor structure provided in one embodiment.

Referring to FIG. 11, in one embodiment, in S40, the second supporting layer 520 may be etched by adopting, but not limited to, a dry etching process to expose the first supporting layer 510 on the top of the double-bit-line to-be-etched structure 210. In the embodiment, the first supporting layer 510 may be the silicon oxide layer and the second supporting layer 520 may be the polysilicon layer.

Figure 12:
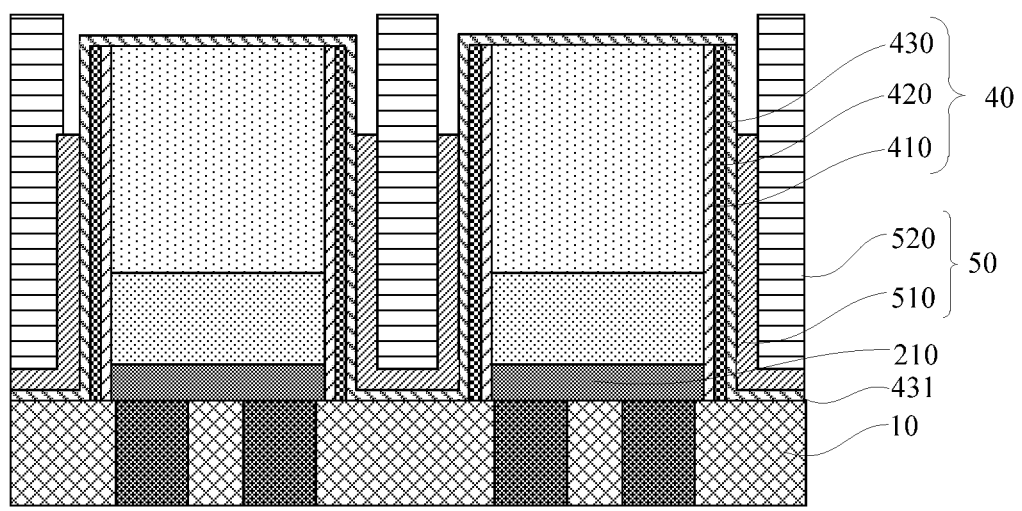
FIG. 12 is a schematic sectional view of a structure obtained after a first supporting layer is etched in a method for manufacturing a semiconductor structure provided in one embodiment.
Figure 13:
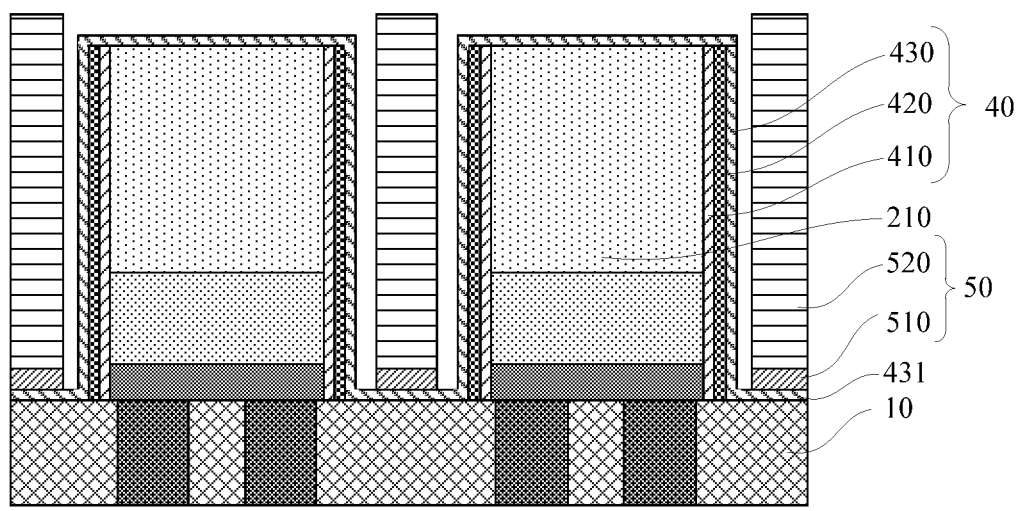
FIG. 13 is another schematic sectional view of a structure obtained after a first supporting layer is etched in a method for manufacturing a semiconductor structure provided in one embodiment.

Referring to FIG. 12 and FIG. 13, in one embodiment, in S40, the first supporting layer 510 may be etched by adopting, but not limited to, a wet etching process. In the embodiment, wet etching may be performed on the first supporting layer 510 by adopting, but not limited to, a mixed liquid of HF, $H_2SO_4$, and $H_2O$, so that a top surface of the first supporting layer 510 is lower than the top surface of the double-bit-line to-be-etched structure 210, that is, lower than the top surface of the first structure 20. The top surface of the first supporting layer 510 is lower than the top surface of the double-bit-line to-be-etched structure 210, so that the double-bit-line to-be-etched structure 210 and the second supporting layer 520 may be exposed in the horizontal direction, so the first supporting layer 510 may be etched downwards for a distance, or the first supporting layer 510 may be etched until the substrate 10 is exposed.

In one embodiment, after the first supporting layer 510 between the first structure 20 and the second supporting layer 520 is removed, the following operations are further included.

In S50, a bit line mask layer 60 is formed on the surface of the double-bit-line to-be-etched structure 210 and the surface of the bit line supporting structures 50. An opening 610 is provided in the bit line mask layer 60, which defines two adjacent bit lines 30, and the first supporting layer 510 and the second supporting layer 520 together form the bit line supporting structures 50.

In S60, the double-bit-line to-be-etched structure 210 is etched based on the bit line mask layer 60 to obtain the two adjacent bit lines 30.

In S70, second sidewall structures 70 are formed on the exposed sidewalls of the two adjacent bit lines 30.

In S80, the bit line mask layer 60 and the bit line supporting structures 50 are removed to expose the first sidewall structures 40.

In one embodiment, in S50, the operation that a bit line mask layer 60 is formed on the surface of the double-bit-line to-be-etched structure 210 and the surfaces of bit line supporting structures 50 includes the following operations.

In S510, a bit line mask material layer 620 is formed on the surface of the double-bit-line to-be-etched structure 210 and the surface of the second supporting layer 520, and a partial region of the bit line mask material layer 620 is recessed to form a step.

In S520, the bit line mask material layer 620 is etched based on the step of the bit line mask material layer 620 to obtain the bit line mask layer 60.

Figure 14:
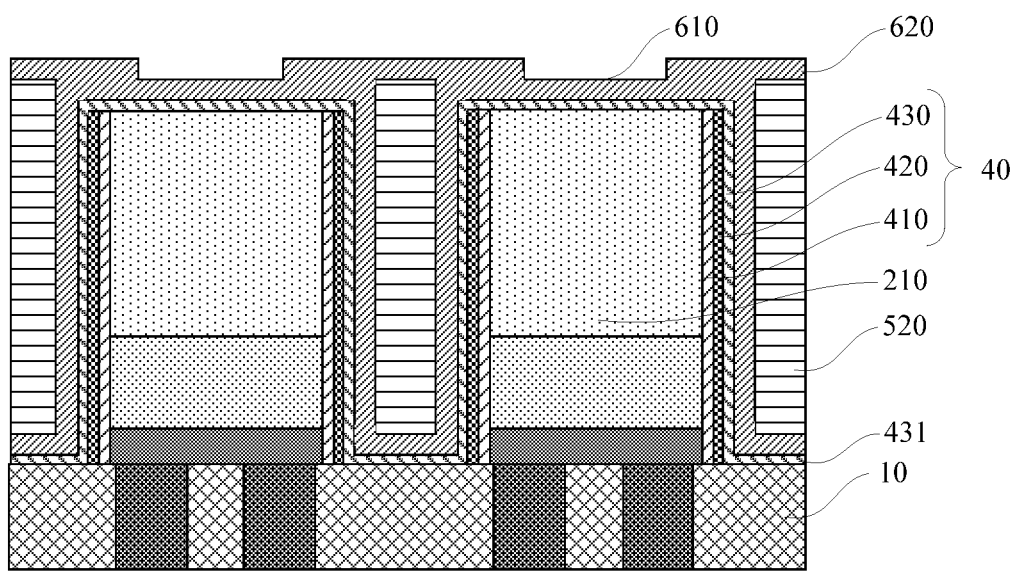
FIG. 14 is a schematic sectional view of a structure obtained after a bit line mask material layer is formed on a surface of a double-bit-line to-be-etched structure and a surface of a second supporting layer in a method for manufacturing a semiconductor structure provided in one embodiment.

Referring to FIG. 14, in one embodiment, in S510, the ALD process may be adopted to form the bit line mask material layer 620 on the surface of the double-bit-line to-be-etched structure 210 and the surface of the second supporting layer 520. The material and thickness of the first supporting layer 510, the material and thickness of the second supporting layer 520, and the material and thickness of the bit line mask layer 60 may all be set according to the actual requirement. In one embodiment, the material of the first supporting layer 510 is the same as the material of the bit line mask layer 60.

In one embodiment, both the material of the first supporting layer 510 and the material of the bit line mask layer 60 include silicon oxide. The second supporting layer 520 includes the polysilicon layer. In the embodiment, the first supporting layer 510 and the bit line mask material layer 620 may include the silicon oxide layer. When the silicon oxide layer is deposited on the surface of the double-bit-line to-be-etched structure 210 and the surface of the second supporting layer 520 by adopting the ALD process, the thickness of upper, lower, left and right parts of the formed silicon oxide layer is the same, while as the thickness of the silicon oxide layer is increased, the opening 610 of the bit line mask material layer 620 becomes smaller gradually, that is, a recessed pattern is formed. Therefore, when the ALD process is adopted to deposit the silicon oxide layer, the second supporting layer 520 may serve as a starting point for the deposition of the silicon oxide layer, so that the opening 610 of the deposited bit line mask material layer 620 becomes smaller and smaller, and may be symmetrical about the center of the double-bit-line to-be-etched structure 210 to achieve the self-alignment in the etching procedure of the bit line 30. Therefore, the thickness of the bit line 30 is positively related to the thickness of the bit line mask material layer 620. In addition, the center line of the opening 610 of the bit line mask layer 60 coincides with the center line of the second supporting layer 520 on both sides of the first structure 20. In the embodiment, the size of the opening 610 of the bit line mask material layer 620 may be controlled by the deposition rate of the ALD process, so that the size of the finally formed bit line 30 may be controlled, the manufacturing flow of the bit line 30 is simplified, and the manufacturing accuracy of the bit line 30 is improved.

Figure 15:
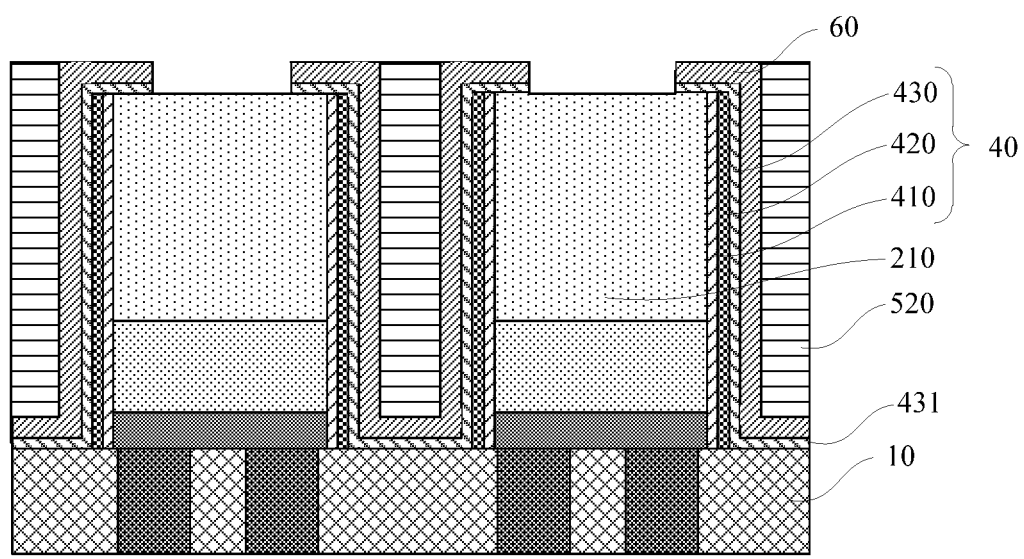
FIG. 15 is a schematic sectional view of a structure obtained after a bit line mask material layer is etched based on a recessed pattern of a bit line mask material layer to obtain a bit line mask layer in a method for manufacturing a semiconductor structure provided in one embodiment.

Referring to FIG. 15, in one embodiment, in S520, the bit line mask material layer 620 may be etched based on the step of the bit line mask material layer 620 by adopting, but not limited to, a dry etching process to obtain the bit line mask layer 60. The bit line mask layer 60 may expose the double-bit-line to-be-etched structure 210. In one embodiment, if the whole third sidewall spacer material layer 431 in the first sidewall structure 40 is retained, the third sidewall spacer material layer 431 may be etched to expose the double-bit-line to-be-etched structure 210.

In one embodiment, in S50, the operation that a bit line mask layer 60 is formed on the surface of the double-bit-line to-be-etched structure 210 and the surfaces of bit line supporting structures 50 includes the following operations.

In S530, the bit line mask material layer 620 is formed on the surfaces of the bit line supporting structures 50.

In S540, the bit line mask material layer 620 is patterned to obtain the bit line mask layer 60.

In one embodiment, in S530, the bit line mask material layer 620 may be formed on the surfaces of the bit line supporting structures 50 by adopting, but not limited to, a deposition process. The material and thickness of the bit line mask material layer 620 may be set according to the actual requirement. In the embodiment, the bit line mask material layer 620 may include the silicon oxide layer.

In one embodiment, in S540, the photoresist layer may be formed on the upper surface of the bit line mask material layer 620 by adopting, but not limited to, a spin-on process, and the photoresist layer is patterned to form the photoetching mask layer. The photoetching mask layer defines two adjacent bit lines 30. The bit line mask material layer 620 or the bit line mask material layer 620 and the third sidewall spacer material layer 431 on the upper surface of the double-bit-line to-be-etched structure 210 are etched based on the photoetching mask layer to expose the double-bit-line to-be-etched structure 210 to obtain the bit line mask layer 60.

Figure 16:
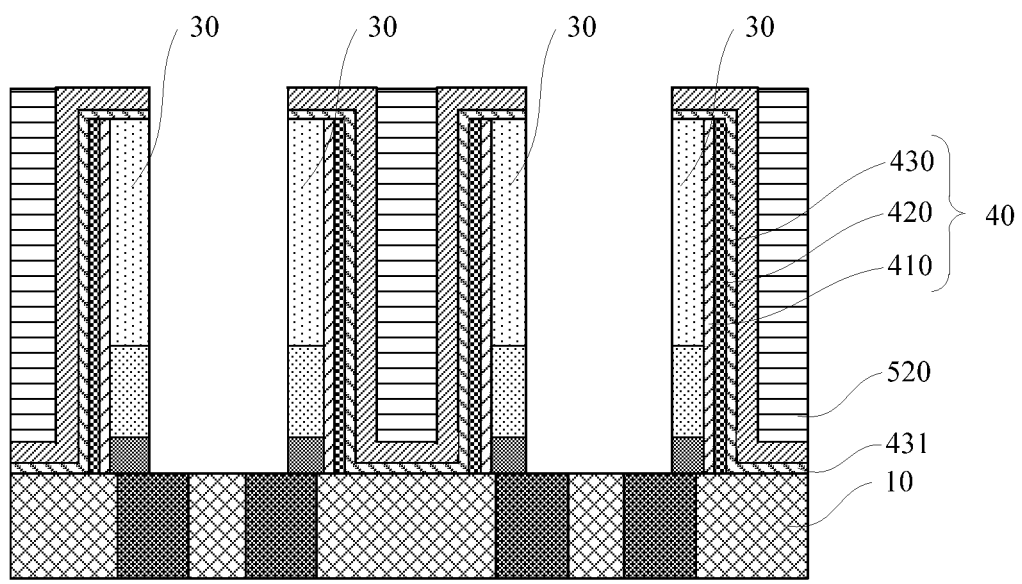
FIG. 16 is a schematic sectional view of a structure obtained after a double-bit-line to-be-etched structure is etched based on a bit line mask layer in a method for manufacturing a semiconductor structure provided in one embodiment.

Referring to FIG. 16, in one embodiment, in S60, the double-bit-line to-be-etched structure 210 may be etched based on the bit line mask layer 60 by adopting, but not limited to, an etching process to expose the substrate 10 to obtain two adjacent bit lines 30.

In one embodiment, in S70, the operation that second sidewall structures 70 is formed on the exposed sidewalls of the two adjacent bit lines 30 includes the following operations.

In S710, first sidewall spacer layers 410 are formed on the exposed sidewalls of the two adjacent bit lines 30.

In S720, second sidewall spacer layers 420 are formed on the surfaces of the first sidewall spacer layers 410.

In S730, third sidewall spacer layers 430 are formed on the surfaces of the second sidewall spacer layers 420.

The first sidewall spacer layers 410, the second sidewall spacer layers 420, and the third sidewall spacer layers 430 together constitute the second sidewall structures 70.

Figure 17:
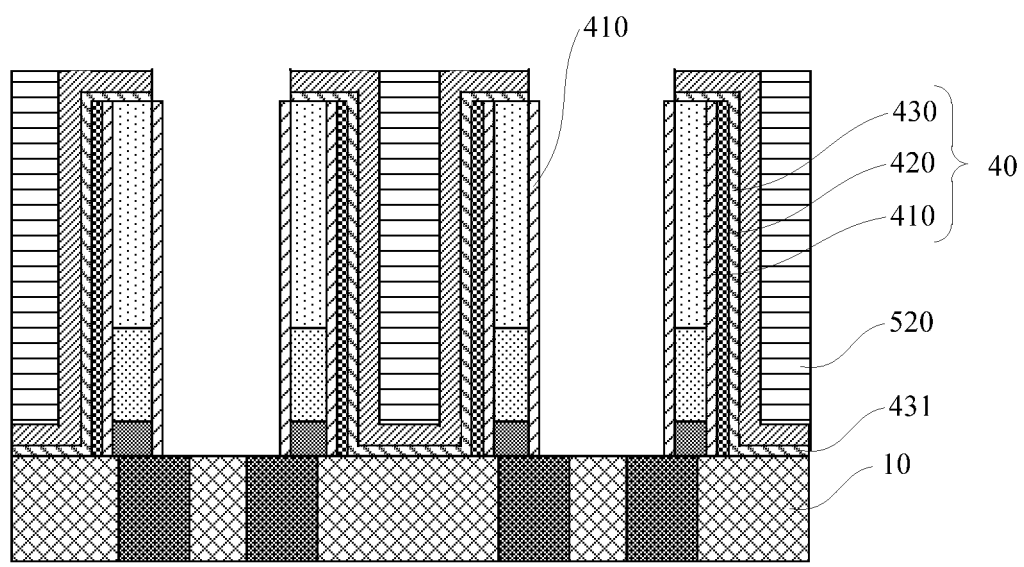
FIG. 17 is a schematic sectional view of a structure obtained after a first sidewall spacer layer is formed on exposed sidewalls of two adjacent bit lines in a method for manufacturing a semiconductor structure provided in one embodiment.

Referring to FIG. 17, in one embodiment, in S710, a first sidewall spacer material layer may be formed by adopting, but not limited to, a deposition process. In the embodiment, the ALD process may be adopted to form the first sidewall spacer material layer on the exposed sidewalls of the two adjacent bit lines 30, the exposed surface of the first supporting layer 510, and the upper surface of the second supporting layer 520. Subsequently, the first sidewall spacer material layer may be etched by adopting, but not limited to, a dry etching process to remove the first sidewall spacer material on the exposed surface of the first supporting layer 510 and on the upper surface of the second supporting layer 520 to form the first sidewall spacer layers 410. The dry etching process may adopt $SF_6$, $CF_4$, $CHF_3$, $O_2$, Ar, or the mixed gas of the above gases, and the selection of the specific gas may be set according to the actual requirement. In addition, the material and thickness of the first sidewall spacer layers 410 may be set according to the actual requirement. In the embodiment, the first sidewall spacer layers 410 may include, but is not limited to, the silicon nitride layer.

Figure 18:
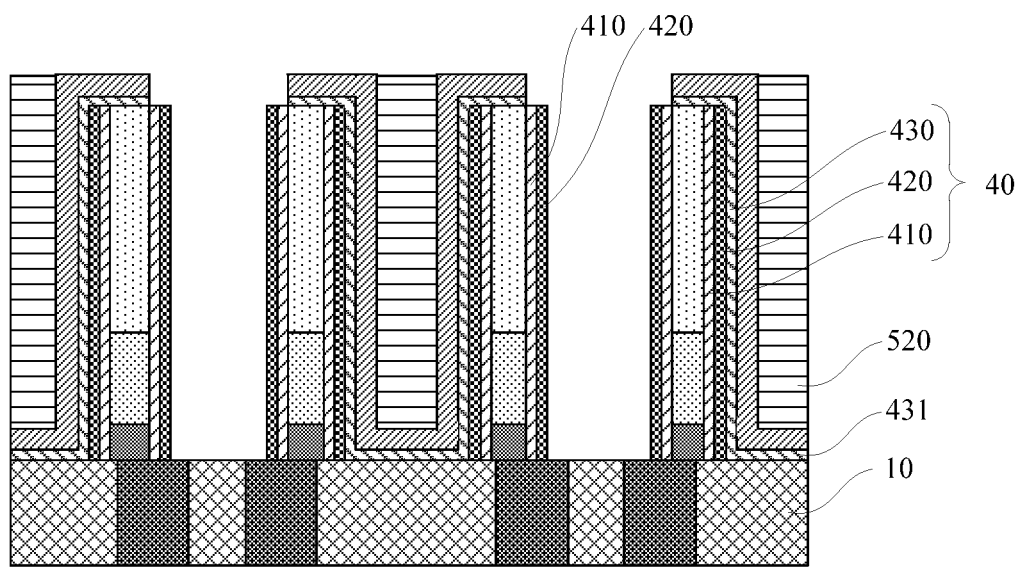
FIG. 18 is a schematic sectional view of a structure obtained after a second sidewall spacer layer is formed on a surface of a first sidewall spacer layer in a method for manufacturing a semiconductor structure provided in one embodiment.

Referring to FIG. 18, in one embodiment, in S720, a second sidewall spacer material layer may be formed by adopting, but not limited to, a deposition process. In the embodiment, the second sidewall spacer material layer may be formed on the surfaces of the first sidewall spacer layers 410, the exposed surface of the first supporting layer 510, and the upper surface of the second supporting layer 520 by adopting the single ALD process. Subsequently, the second sidewall spacer material layer may be etched by adopting, but not limited to, a dry etching process to remove the second sidewall spacer material on the exposed surface of the first supporting layer 510 and on the upper surface of the second supporting layer 520 to form the second sidewall spacer layers 420. The dry etching process may adopt $SF_6$, $CF_4$, $CHF_3$, $O_2$, Ar, or the mixed gas of the above gases, and the selection of the specific gas may be set according to the actual requirement. In addition, the material and thickness of the second sidewall spacer layers 420 may be set according to the actual requirement. In the embodiment, the second sidewall spacer layers 420 may include, but is not limited to, a silicon oxide layer.

Figure 19:
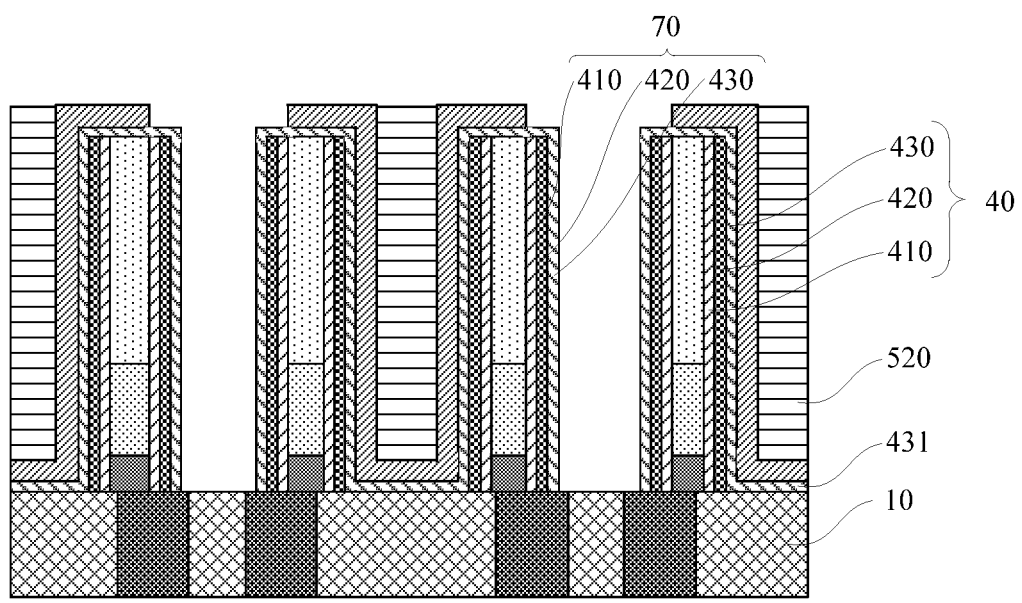
FIG. 19 is a schematic sectional view of a structure obtained after a third sidewall spacer layer is formed on a surface of a second sidewall spacer layer in a method for manufacturing a semiconductor structure provided in one embodiment.

Referring to FIG. 19, in one embodiment, in S730, a third sidewall spacer material layer 431 may be formed by adopting, but not limited to, a deposition process. In the embodiment, the first sidewall spacer material layer may be formed on the surfaces of the second sidewall spacer layers 420, the exposed surface of the first supporting layer 510, and the upper surface of the second supporting layer 520 by adopting the single ALD process. Subsequently, the third sidewall spacer material layer may be etched by adopting, but not limited to, a dry etching process to remove the third sidewall spacer material on the exposed surface of the first supporting layer 510 and on the upper surface of the second supporting layer 520 to form the third sidewall spacer layers 430. The dry etching process may adopt $SF_6$, $CF_4$, $CHF_3$, $O_2$, Ar, or the mixed gas of the above gases, and the selection of the specific gas may be set according to the actual requirement. In addition, the material and thickness of the third sidewall spacer layers 430 may be set according to the actual requirement. In the embodiment, the third sidewall spacer layers 430 may include, but is not limited to, the silicon nitride layer.

Figure 20:
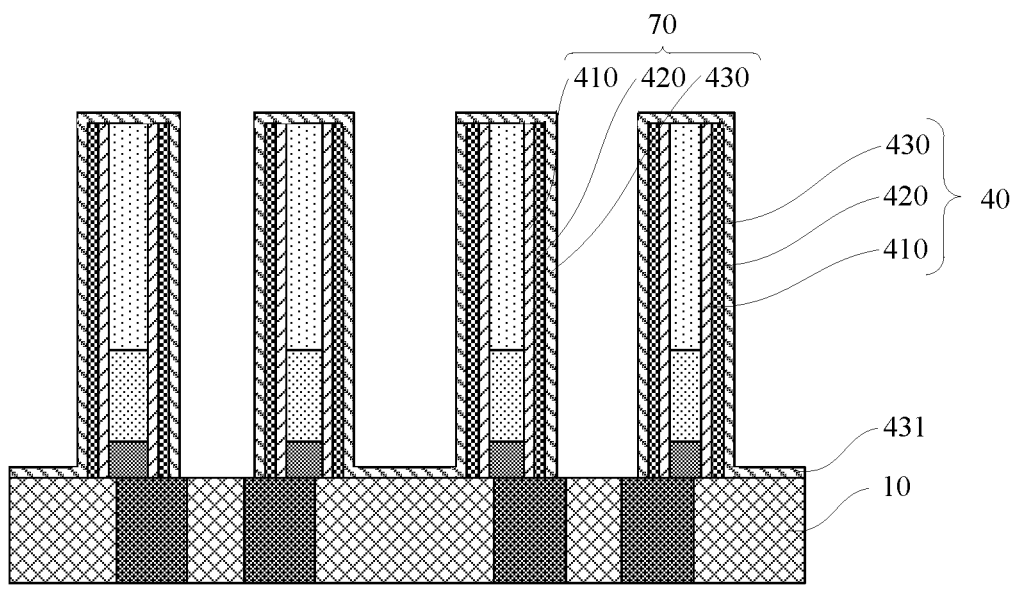
FIG. 20 is a schematic sectional view of a structure obtained after a bit line mask layer and a bit line support structure are removed in a method for manufacturing a semiconductor structure provided in one embodiment.

Referring to FIG. 20, in one embodiment, in S80, the bit line mask layer 60 may be removed by adopting, but not limited to, an etching process. When the material of the bit line mask layer 60 and the material of the first supporting layer 510 are the same, the bit line mask layer 60 may be removed while removing the first supporting layer 510. In one embodiment, the first supporting layer 510 and the second supporting layer 520 in the support structure may be etched by adopting, but not limited to, a wet etching process to remove all of the first supporting layer 510 and the second supporting layer 520. In the embodiment, wet etching may be performed on the first supporting layer 510 and the second supporting layer by adopting, but not limited to, the mixed liquid of HF, $H_2SO_4$, and $H_2O$ to expose the first sidewall structures 40. In one embodiment, the first supporting layer 510 may include the silicon oxide layer and the second supporting layer 520 may include the polysilicon layer. In the embodiment, the polysilicon layer and the silicon oxide layer may be sequentially removed by adopting, but not limited to, a wet etching to expose the first sidewall structures 40.

Figure 21:
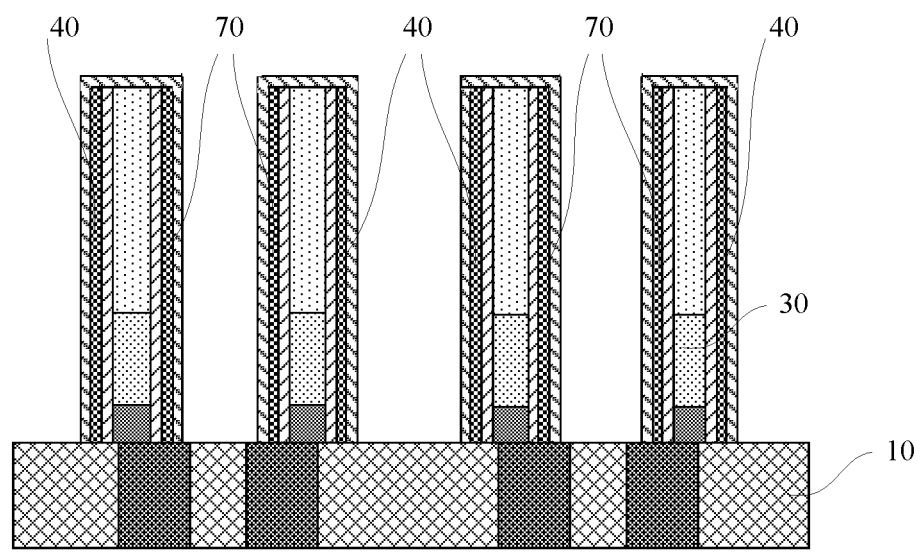
FIG. 21 is a schematic sectional view of a structure obtained after a third sidewall spacer material layer located on an upper surface of the substrate is removed to form first sidewall structures in a method for manufacturing a semiconductor structure provided in one embodiment.

Referring to FIG. 21, in one embodiment, if the whole third sidewall spacer material layer 431 in the first sidewall structures 40 is retained, the third sidewall spacer material layer 431 on the upper surface of the substrate 10 needs to be removed finally to form the first sidewall structures 40.

In one embodiment, the double-bit-line to-be-etched structure 210 is formed on the upper surface of the substrate 10, and the width of the double-bit-line to-be-etched structure 210 is the sum of the width between two adjacent bit lines 30 and the widths of the two bit lines 30. The first sidewall structures 40 are formed on the sidewalls of the double-bit-line to-be-etched structure 210, thereby ensuring the good attachment between the first sidewall structures 40 and the two adjacent bit lines 30. The first supporting layer 510 is formed on the upper surface of the double-bit-line to-be-etched structure 210, the surface of the first sidewall structures 40, and the upper surface of the substrate 10, and the second supporting layer 520 is formed in the gap 220 between adjacent double-bit-line to-be-etched structures 210 after the first supporting layer 510 is formed. The first supporting layer 510 and the second supporting layer 520 may support the bit line 30 during forming the second sidewall structures 70 of the bit line 30, thereby preventing the bit line 30 from distorting or tilting. The bit line mask layer 60 is formed on the surface of the double-bit-line to-be-etched structure 210 and the surface of the bit line supporting structures 50, and two adjacent bit lines 30 may be obtained by etching the double-bit-line to-be-etched structure 210 based on the bit line mask layer 60. The second sidewall structures 70 is formed on the exposed sidewalls of the two adjacent bit lines 30, and the bit line supporting structures 50 is removed, that is, the manufacturing of the two adjacent bit lines 30 is completed. Therefore, in the above method for manufacturing a semiconductor structure, the first sidewall structures 40 and the second sidewall structures 70 may wrap the sidewalls of the bit lines 30 well, thereby ensuring that a wire may be well filled between the transistor and the capacitor subsequently, and ensuring the performance of the DRAM.

Based on the same inventive concept, the present disclosure further provides a semiconductor structure, manufactured by adopting the method for manufacturing a semiconductor structure of any above embodiment, and it will not be repeated herein.

The technical features of the above embodiments may be combined freely. In order to describe briefly, the description is not made on all possible combinations of the technical features of the embodiments. However, the combinations of these technical features should be considered as a scope of the specification as long as there is no contradiction among them.

The above embodiments only express several implementations of the present disclosure, are described in more detail, but are not to be construed as a limitation to the scope of the present disclosure. It is to be noted that several variations and modifications may also be made by those skilled in the art without departing from the spirit of the present disclosure, which all fall within the protection scope of the present disclosure. Therefore, the protection scope of the patent of the present disclosure shall be subjected to the appended claims.

The invention claimed is:

1. A method for manufacturing a semiconductor structure, comprising:
   providing a substrate;
   forming a double-bit-line to-be-etched structure on an upper surface of the substrate;
   forming first sidewall structures on sidewalls of the double-bit-line to-be-etched structure, wherein the double-bit-line to-be-etched structure and the first sidewall structures together form a first structure;
   forming a first supporting layer, the first supporting layer covering the first structure;
   forming a second supporting layer, the second supporting layer covering the first supporting layer; and removing the first supporting layer on an upper surface of the first structure and between the first structure and the second supporting layer as well as the second supporting layer on the upper surface of the first structure, a top surface of the second supporting layer being higher than a top surface of the first structure.

2. The method of claim 1, wherein forming the double-bit-line to-be-etched structure on the upper surface of the substrate comprises:
   forming a bit line material layer comprising a bit line barrier layer, a bit line conductive layer and a covering insulating layer on the upper surface of the substrate; and
   etching the bit line material layer to obtain the double-bit-line to-be-etched structure, the substrate being exposed between the double-bit-line to-be-etched structure and an adjacent, second double-bit-line to-be-etched structure.

3. The method of claim 1, further comprising: after removing the first supporting layer between the first structure and the second supporting layer,
   forming a bit line mask layer on a surface of the double-bit-line to-be-etched structure and surfaces of bit line supporting structures, an opening being provided in the bit line mask layer, the opening defining two adjacent bit lines, and the first supporting layer and the second supporting layer together constituting the bit line supporting structures;
   etching the double-bit-line to-be-etched structure based on the bit line mask layer to obtain the two adjacent bit lines;
   forming second sidewall structures on exposed sidewalls of the two adjacent bit lines; and
   removing the bit line mask layer and the bit line supporting structures to expose the first sidewall structures.

4. The method of claim 3, wherein a center line of the opening of the bit line mask layer coincides with a center line of the second supporting layer on both sides of the first structure.

5. The method of claim 3, wherein forming the bit line mask layer on the surface of the double-bit-line to-be-etched structure and the surface of the bit line supporting structures comprises:
   forming a bit line mask material layer on the surface of the double-bit-line to-be-etched structure and a surface of the second supporting layer, a partial region of the bit line mask material layer being recessed to form a step; and
   etching the bit line mask material layer based on the step of the bit line mask material layer to obtain the bit line mask layer.

6. The method of claim 5, wherein a thickness of the two adjacent bit lines is positively related to a thickness of the bit line mask material layer.

7. The method of claim 3, wherein forming the bit line mask layer on the surface of the double-bit-line to-be-etched structure and the surfaces of the bit line supporting structures comprises:
   forming a bit line mask material layer on the surfaces of the bit line supporting structures; and
   patterning the bit line mask material layer to obtain the bit line mask layer.

8. The method of claim 3, wherein both a material of the first supporting layer and a material of the bit line mask layer comprise silicon oxide, and the second supporting layer comprises a polysilicon layer.

9. The method of claim 8, wherein first sidewall structures comprise a first silicon nitride layer, a silicon oxide layer and a second silicon nitride layer which are sequentially stacked from the sidewalls of the double-bit-line to-be-etched structure to outside, the second silicon nitride layer also covering an upper surface of the double-bit-line to-be-etched structure and an exposed upper surface of the substrate.

10. A semiconductor structure, manufactured by the method of claim 1.

* * * * *